(12) United States Patent
Chang

(10) Patent No.: US 9,059,526 B2
(45) Date of Patent: Jun. 16, 2015

(54) ELECTICAL CONNECTOR ASSEMBLY HAVING A BLOCK FOR STOPING A CHIP MODULE COMING OFF

(71) Applicant: HON HAI PRECISION INDUSTRY CO., LTD., New Taipei (TW)

(72) Inventor: Chun-Yi Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 33 days.

(21) Appl. No.: 13/925,864

(22) Filed: Jun. 25, 2013

(65) Prior Publication Data

US 2013/0344715 A1 Dec. 26, 2013

(30) Foreign Application Priority Data

Jun. 25, 2012 (TW) .............................. 101212136 U

(51) Int. Cl.
*H01R 12/00* (2006.01)
*H01R 13/42* (2006.01)
*H05K 7/10* (2006.01)

(52) U.S. Cl.
CPC .............. *H01R 13/42* (2013.01); *H05K 7/1053* (2013.01)

(58) Field of Classification Search
USPC ....................... 439/331, 342, 595, 754, 68–73
See application file for complete search history.

(56) References Cited

U.S. PATENT DOCUMENTS

| 4,696,526 | A | * | 9/1987 | Newton et al. ................... 439/68 |
| 5,073,116 | A | * | 12/1991 | Beck, Jr. ......................... 439/71 |
| 5,499,929 | A | * | 3/1996 | Miyazawa ..................... 439/331 |
| 5,530,291 | A | * | 6/1996 | Chan et al. ..................... 257/723 |
| 5,791,914 | A | * | 8/1998 | Loranger et al. ................ 439/71 |
| 7,083,457 | B2 | * | 8/2006 | Ma ................................. 439/331 |
| 7,101,209 | B2 | * | 9/2006 | Yates et al. .................... 439/331 |

FOREIGN PATENT DOCUMENTS

TW M411042 9/2011

* cited by examiner

*Primary Examiner* — Jean F Duverne
(74) *Attorney, Agent, or Firm* — Wei Te Chung; Ming Chieh Chang

(57) ABSTRACT

An electrical connector electrically connecting a chip module to a printed circuit board, and includes an insulative housing, a plurality of terminals received in the insulative housing and a block assembled to the insulative housing, the electrical connector comprises a bottom wall and a plurality of side walls, between the bottom wall and the side walls forms a receiving space to receive the chip module for assembling the chip module from top to bottom in vertical direction, the block is configured with frame shape and comprises a plurality of tabs, the insulative housing comprises a plurality of slots matched with the tabs, the block can prevent the chip module coming off from the insulative housing while the chip module received in the receiving space.

20 Claims, 6 Drawing Sheets

ELECTICAL CONNECTOR ASSEMBLY HAVING A BLOCK FOR STOPING A CHIP MODULE COMING OFF

BACKGROUND OF THE INVENTION

1. Field of the Invention

The present invention relates to an electrical connector assembly, and more particularly to an electrical connector assembly fixing the chip module to the printed circuit board.

2. Description of the Prior Art

An electrical connector assembly includes an electrical connector, the electrical connector electrically connecting a chip module to a printed circuit board is described in Tai Wan Patent No. 411,042, issued to LIAO on Sep. 1, 2011. The electrical connector includes a socket body with a plurality of electrical contacts secured therein. The chip module is pressed by the heat sink and the heat sink is fixed to the printed circuit board by a number of screws for providing the pressure of the chip module. After the chip module is assembled to the electrical connector and not fixed to the printed circuit board, the chip module may come off from it and damage the terminal. When the heat sink is locked to the printed circuit board, the chip module can not be fixed to the printed circuit board in accurate position.

Therefore, it is needed to find a new electrical socket to overcome the problems mentioned above.

SUMMARY OF THE INVENTION

Accordingly, an object of the present invention is to prevent the chip module coming off from the insulative housing.

In order to achieve the object set forth, an electrical connector electrically connecting a chip module to a printed circuit board, and comprises an insulative housing, a plurality of terminals received in the insulative housing and a block assembled to the insulative housing, the electrical connector comprises a bottom wall and a plurality of side walls, between the bottom wall and the side walls forms a receiving space to receive the chip module for assembling the chip module from top to bottom in vertical direction, the block is configured with frame shape and comprises a plurality of tabs, the insulative housing comprises a plurality of slots matched with the tabs, the block can prevent the chip module coming off from the insulative housing while the chip module received in the receiving space.

DESCRIPTION OF PREFERRED EMBODIMENT

Figure 1:
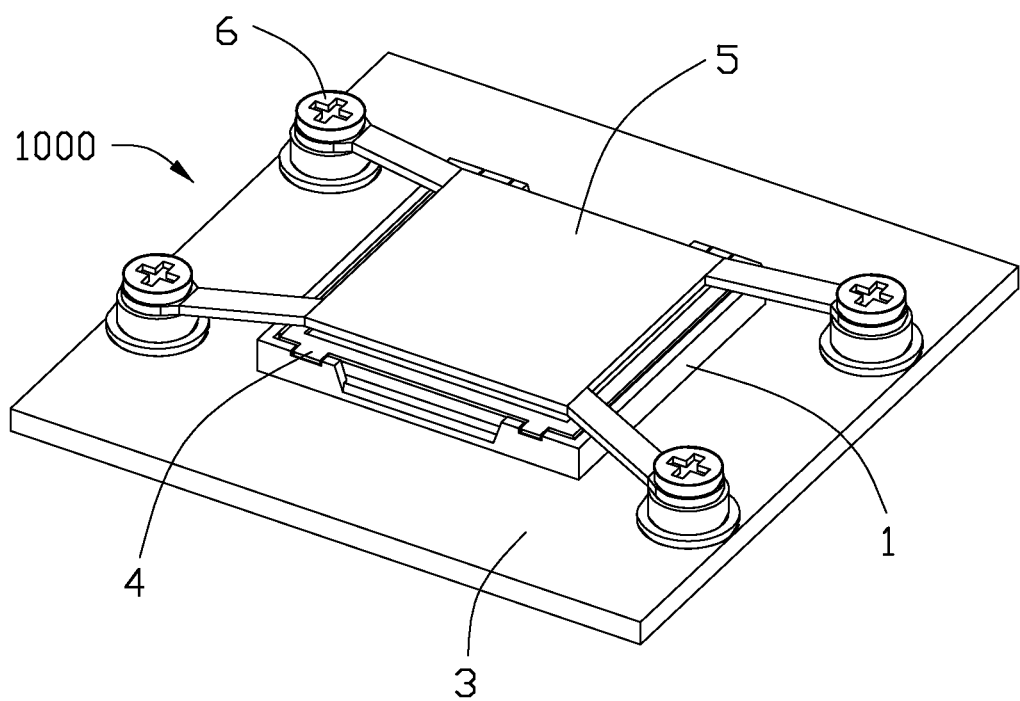
FIG. 1 is an isometric, assembled view of an electrical connector assembly in accordance with a preferred embodiment of the present invention.

Reference will now be made to the drawings to describe the present invention in detail.

Referring to FIGS. 1-6, an electrical connector 1000 according to the present invention comprises a printed circuit board 3, an electrical connector 100 assembled to the printed circuit board 3, a chip module 2 assembled to the electrical connector 100 and a fixing device (not show) fixing the electrical connector 100 along with the chip module 2 to the printed circuit board 3. The electrical connector 100 comprises an insulative housing 1, a plurality of terminals (not show) retained therein and a retaining block 4 assembled at the insulative housing 1. The fixing device comprises a pressing element 5 for pressing the chip module 2 and a plurality of screws 6 fixing the chip module 2 to the printed circuit board 3.

Figure 5:
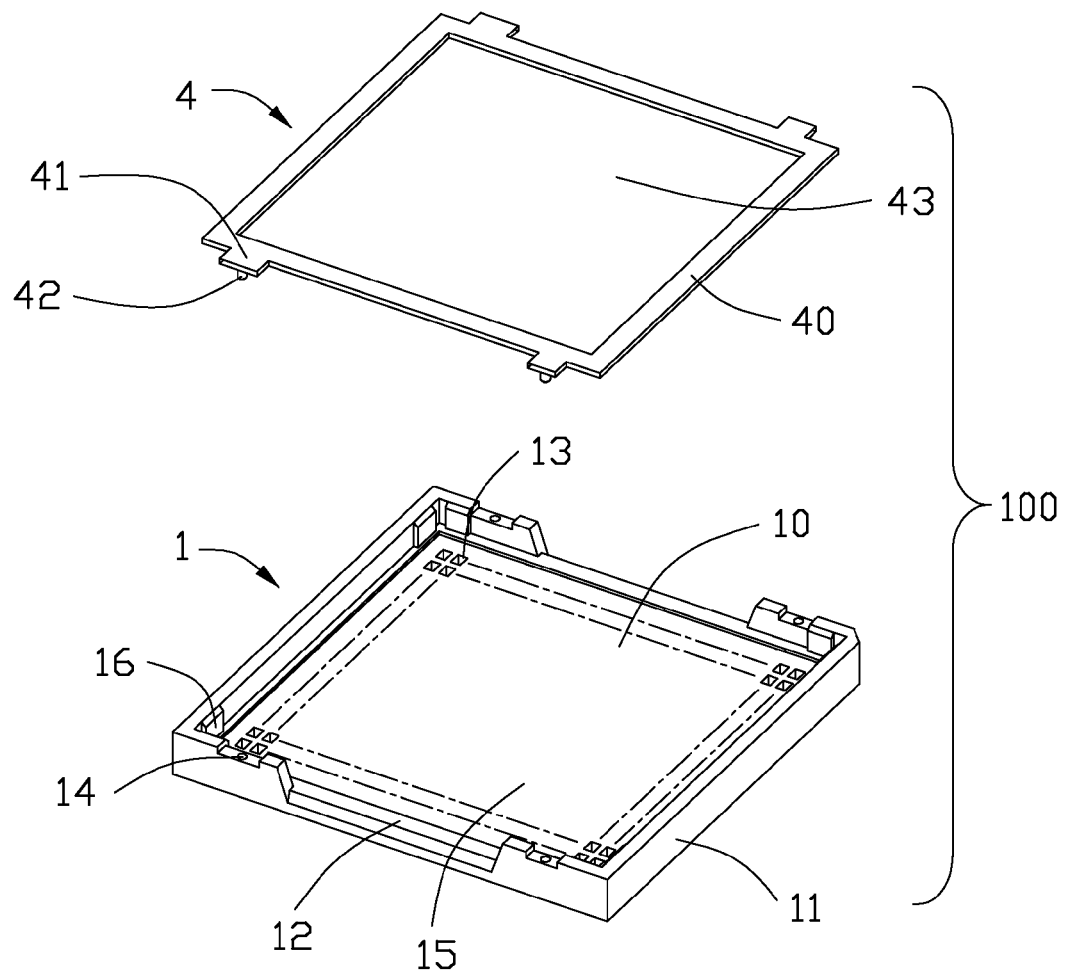
FIG. 5 is an exploded view of the electrical connector show in FIG. 1.
Figure 6:
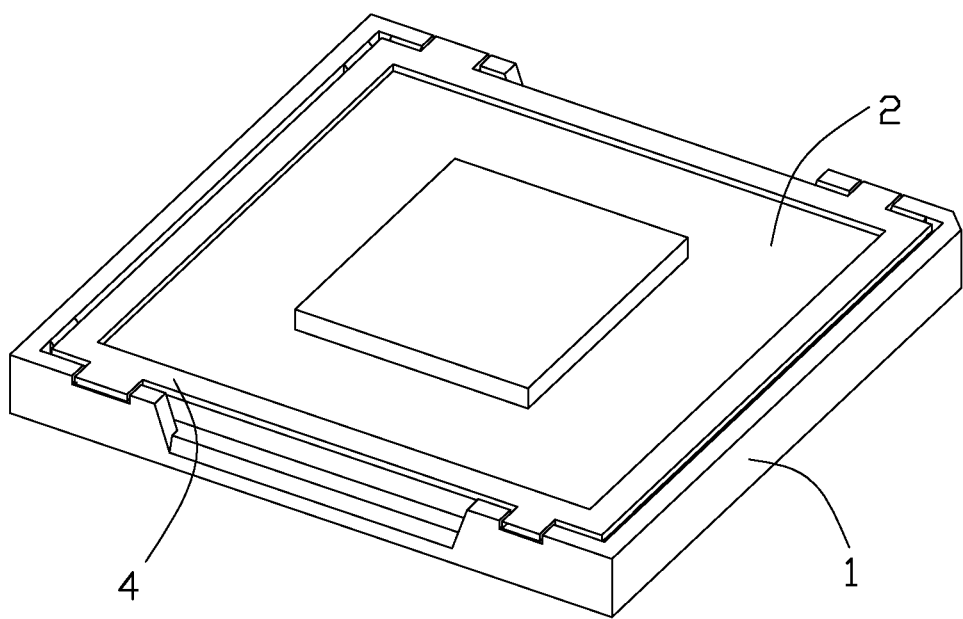
FIG. 6 is an isometric view of the electrical connector that the chip module assembled thereof show in FIG. 1.

Referring to FIG. 5, the insulative housing 1 comprises a bottom wall 10 and four side walls 11 extending upwardly from the bottom wall 10. The side walls 11 have a plurality of slots 14 cooperated with the block 4. The bottom wall 10 has a plurality of receiving holes 13 for receiving the terminals. Each of a pair of side walls 11 has a breach 12 respectively. The breach 12 is configured with inverted trapezoidal shape and located in the middle of the side wall 11. Between the bottom wall 10 and the side walls 11 forms a receiving space 15 to receive the chip module 2 for assembling the chip module 2 from top to bottom in a vertical direction. Near the corners of the side walls 11 have a plurality of leading portions 16 protruding to the receiving space 15 for leading the chip module 2 to assemble to the insulative housing 1, the leading portions 11 prevents the chip module 2 from moving in a horizontal direction perpendicular to the vertical direction.

The block 4 is configured with a frame shape and the block 4 has an open 43. The block 4 comprises a base 40, a plurality of extending portions 41 extending outwardly from the base 40 and a plurality of tabs 42 protruding to the insulative housing 1. The extending portion 41 located near a corner of the base 40.

Figure 3:
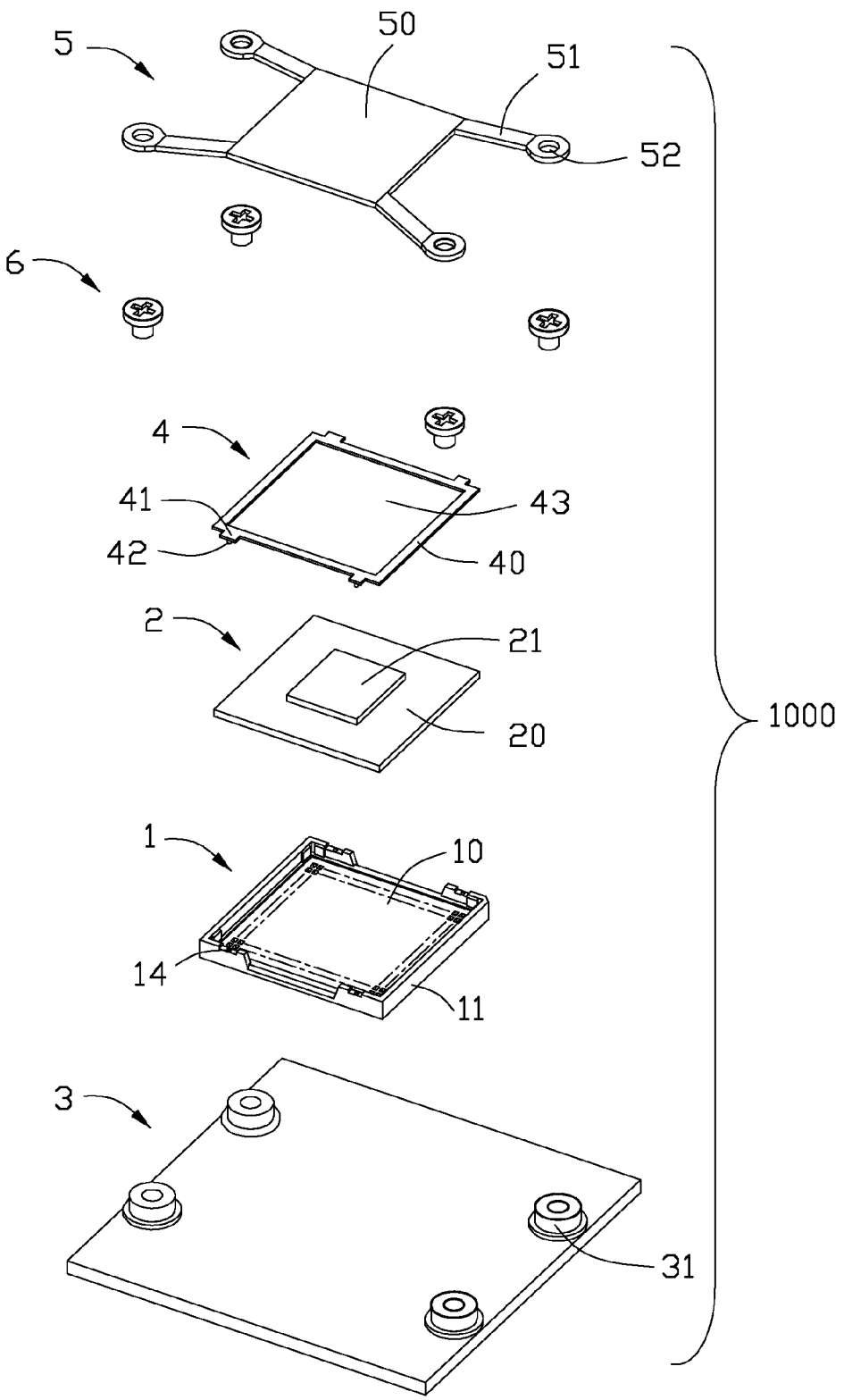
FIG. 3 is an exploded view of the electrical connector assembly shown in FIG. 1.
Figure 4:
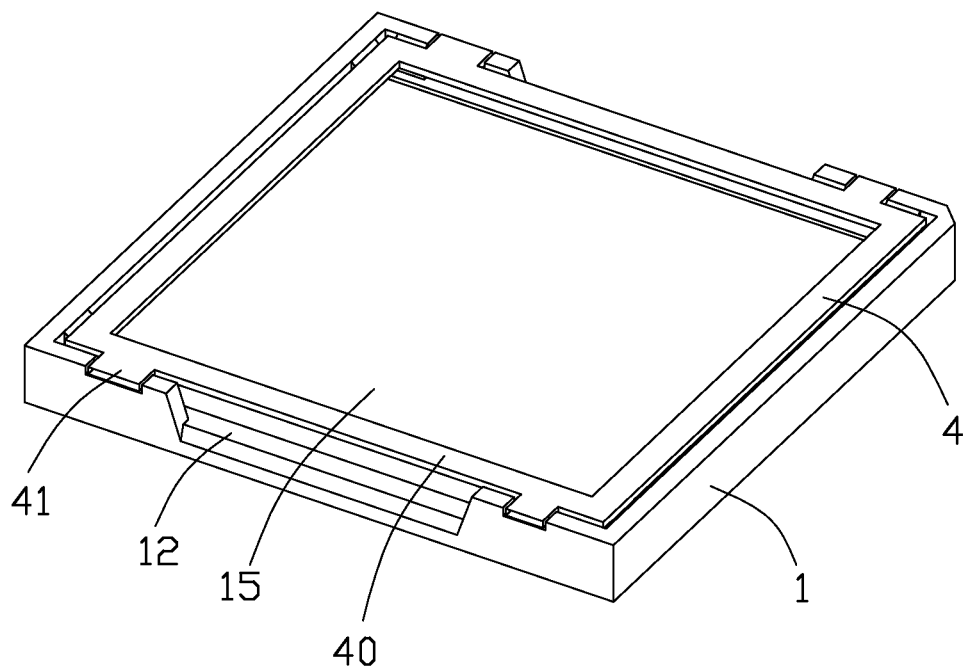
FIG. 4 is isometric, assembled view of the electrical connector shown in FIG. 1.

Referring to FIG. 3, the chip module 2 is step shaped and comprises a substrate 20 and a die 21 protruding from a middle of the substrate 20. The bottom surface of the substrate 20 has a plurality of pads (not show) to contact with the terminals for electrically connecting the chip module 2 to the electrical connector 100. The printed circuit board 3 is flat plate and it comprises a plurality of retention portions 31. The pressing element 5 is configured with X shaped and it comprises a flat body portion 50, a plurality of connecting portions 51 extending outwardly from at least four corners of the body portion 50. Each of the ends of the connecting portions 51 have a through hole 52 for receiving the screws 6. The screws 6 cooperate with the retention portions 31 of the printed circuit board 3.

When assembling the electrical connector assembly, first assembled the chip module 2 to the insulative housing 1, then assembled the block 4 to the insulative housing 1 and the block 4 pressed the chip module 2, but the pressure of the block 4 is so small that it can not achieve the stable electrically connection between the electrical connector 100 and the chip module 2. The block 4 can prevent the chip module 2 coming off from the insulative housing 1 through the interference of the tabs 42 and the slots 14.

Figure 2:
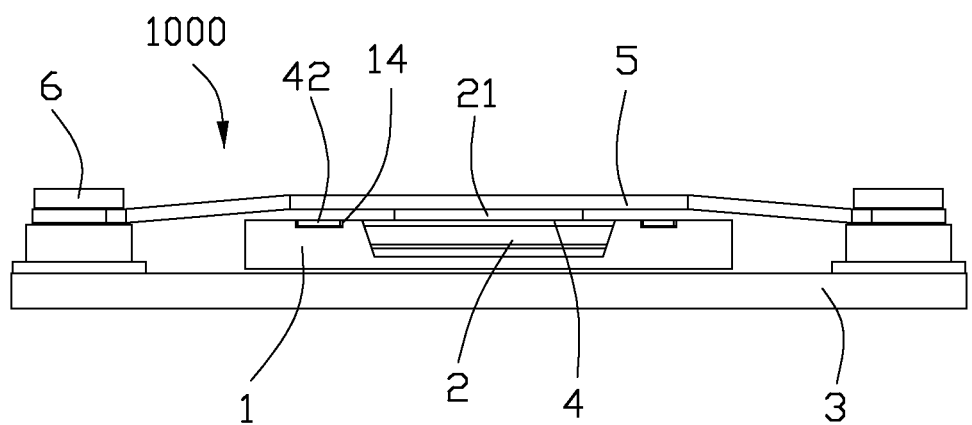
FIG. 2 is a side view of the electrical connector assembly as shown in FIG. 1.

Referring to FIGS. 1-2, after assembling the electrical connector assembly 1000, the pressing element 5 is fixed to the printed circuit board 3 by the screws 6. The body portion 50 presses the chip module 2 and it provides the pressing force for the chip module 2 and achieve the stable electrically connection of the chip module 2 and the electrical connector 100. The height of the block 4 is smaller than the height of the die 21 of the chip module 2. So, after assembling the block 4 to the insulative housing 1, the block 4 can not be removed until the pressing element 5 fixed to the printed circuit board 3. The height of the block 4 that assembled to the insulative housing 1 is equal to the height of the side walls 11.

After the chip module 2 received in the receiving space 15, the block 4 can prevent the chip module 2 coming off from the insulative housing 1 while the chip module 2 assembled to the insulative housing 1 and not fixed to the printed circuit board 3, and it can prevent the damage of the chip module 2 and offsetting of the chip module 2.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector electrically connecting a chip module to a printed circuit board, and comprising:
   an insulative housing comprising a bottom wall and a plurality of side walls, between the bottom wall and the side walls forms a receiving space to receive the chip module for assembling the chip module from top to bottom in a vertical direction;
   a plurality of terminals received in the insulative housing; and wherein
   the electrical connector further comprises a block assembled to the insulative housing, the block is configured with frame shape and comprises a plurality of tabs, the insulative housing comprises a plurality of slots defined on a top surface of the side wall and downwardly recessed, the block is mounted on the insulative housing via the tabs downwardly inserted into and then interfering with the slots after the chip module is received in the receiving space for preventing the chip module from being dropping off.

2. The electrical connector as claimed in claim 1, wherein said block comprises a base and a plurality of extending portions outwardly extending from the base, the tab downwardly protrudes from the extending portion, the sidewall further defines a plurality of notches receiving the extending portions, the slot is defined on a bottom of the notch.

3. The electrical connector as claimed in claim 1, wherein said slots located at the side walls of the insulative housing, each of the pair of side walls has a breach inward and outward through each side wall convenient to get off the chip module respectively.

4. The electrical connector as claimed in claim 1, wherein a top surface of the block after being assembled to the insulative housing is not higher than the side wall, said middle of the block has an open for receiving the chip module.

5. An electrical connector assembly comprising:
   an electrical connector, assembled to the printed circuit board, and comprising an insulative housing and a plurality of terminals received therein;
   a chip module assembled at the electrical connector, the chip module having a substrate and a die protruding upwardly from a center portion of the substrate;
   a block assembled to and upon the insulative housing and pressing on an upper surface of the substrate of the chip module, and a top surface of the block being not higher than that of the die; and
   a fixing device, fixing the electrical connector to the printed circuit board, and comprising a pressing element used for pressing the chip module.

6. The electrical connector assembly as claimed in claim 5, wherein the block comprises a plurality of tabs, the insulative housing comprises a plurality of slots interfering with the tabs.

7. The electrical connector assembly as claimed in claim 6, wherein said block comprises a base and a plurality of extending portions, the tab protruding from the extending portion to the insulative housing, the extending portions located near the corners of the insulative housing, the slots located at the side walls of the insulative housing.

8. The electrical connector assembly as claimed in claim 5, wherein the insulative housing has two opposite pairs of side walls connecting with each other to form a receiving space, each of a pair of side walls has a breach communicating with the receiving space convenient to get off the chip module respectively, the middle of the block has an open configured with frame shape.

9. The electrical connector assembly as claimed in claim 5, wherein the pressing element is configured with X-shaped.

10. The electrical connector assembly as claimed in claim 8, wherein said fixing device further comprises a plurality of screws used for connecting the pressing element and to the printed circuit board, the printed circuit board has a plurality of retention portions matched with the screws.

11. The electrical connector assembly as claimed in claim 10, wherein said pressing element comprises a flat body portion and a plurality of connecting portions extending outwardly from the corners of the body portion.

12. The electrical connector assembly as claimed in claim 11, wherein each of the ends of the connecting portions have a through hole for passing through the connecting portions.

13. The electrical connector assembly as claimed in claim 10, wherein said screws passing through the pressing element and fixing the chip module to the printed circuit board along with the electrical connector to achieve the electrically connecting of the chip module and the printed circuit board.

14. An electrical connector assembly comprising:
   a printed circuit board;
   an insulative housing positioned upon the printed circuit board and including a bottom wall and a plurality of side walls extending upwardly from a peripheral region of the bottom wall to commonly define an upward facing rectangular receiving cavity;
   a rectangular electronic package received within the receiving cavity, said electronic package being equipped with a die raising upward at a center region of the electronic package;
   a retaining device located around the side walls to retain a peripheral region of the electronic package to prevent the electronic package from being upwardly withdrawn from the housing while upwardly exposing the die; and
   a pressing element defining a center body portion downwardly abutting against the die and plurality of connecting portions outwardly extending from the center body portion to be secured to the printed circuit board beside the housing.

15. The electrical connector assembly as claimed in claim 14, wherein said pressing element cooperates with the retaining device without interference therebetween.

16. The electrical connector assembly as claimed in claim 14, wherein the connecting portions are secured to the printed circuit board via upward retention portions and screws, respectively.

17. The electrical connector assembly as claimed in claim 14, wherein said retaining device is fully located below the body portion.

18. The electrical connector assembly as claimed in claim 14, wherein said retaining device is discrete from the housing while being securely assembled to top faces of said side walls.

19. The electrical connector assembly as claimed in claim 14, wherein said retaining device downwardly presses the electronic package.

20. The electrical connector assembly as claimed in claim 14, wherein the retaining device forms an opening through which the die upwardly extends, and an upper surface of the die is higher than a top surface of the retaining device.

* * * * *